United States Patent [19]

Van Thillo et al.

[11] Patent Number: 5,270,147
[45] Date of Patent: Dec. 14, 1993

[54] STRIPPING FILM MATERIAL

[75] Inventors: Etienne A. Van Thillo, Essen; Eddie R. Daems; Luc H. Leenders, both of Herentals; Guido J. Smits, Kapellen, all of Belgium

[73] Assignee: Agfa-Gevaert N.V., Mortsel, Belgium

[21] Appl. No.: 902,825

[22] Filed: Jun. 23, 1992

[30] Foreign Application Priority Data

Jul. 12, 1991 [EP] European Pat. Off. ........ 91201825.6

[51] Int. Cl.$^5$ .............................................. G03C 1/805
[52] U.S. Cl. .................................... 430/262; 430/263; 430/259
[58] Field of Search .............. 430/262, 263, 259, 256; 428/202

[56] References Cited

U.S. PATENT DOCUMENTS

| | | | |
|---|---|---|---|
| 3,846,134 | 11/1974 | Paesschen | 430/514 |
| 4,191,572 | 3/1980 | Cohen et al. | 430/260 |
| 4,456,680 | 6/1984 | Nakamura et al. | 430/258 |
| 4,914,039 | 4/1990 | Wanat | 430/143 |
| 5,043,247 | 8/1991 | Daems et al. | 430/257 |
| 5,059,509 | 10/1991 | Mino et al. | 430/257 |
| 5,068,165 | 11/1991 | Coppens et al. | 430/204 |

Primary Examiner—Charles L. Bowers, Jr.
Assistant Examiner—John A. McPherson
Attorney, Agent, or Firm—William J. Daniel

[57] ABSTRACT

A stripping film material comprises a polyethylene terephthalate film base serving as temporary support being coated with a subbing layer essentially consisting of either:

(1) hydroxypropylcellulose wherein the molar degree of substitution (DS) with hydroxypropyl groups is in the range of 3 to 1, or:

(2) a copoly(vinyl acetate/crotonic acid) having a weight ratio of vinyl acetate to crotonic acid in the range of 85/15 to 99/1, wherein said subbing layer is coated with at least one hydrophilic colloid layer which is adapted to be stripped off after being moistened with an aqueous liquid, e.g. by contact with a wet surface of a permanent support.

8 Claims, No Drawings

STRIPPING FILM MATERIAL

1. FIELD OF THE INVENTION

The present invention relates to a stripping film having a polyester base and its use in photographic imaging.

2. BACKGROUND OF THE INVENTION

For some purposes in the production of photographic images it is desirable to transfer hydrophilic colloid layers from a temporary support onto a permanent support to produce thereon the final image.

The transfer of a hydrophilic colloid layer or portions thereof from a temporary support to a permanent support is known e.g. in the production of decalcomanias, gravure resists, photostencils and wash-off processable photosensitive recording materials. Examples of the latter materials are described in U.S. Pat. Nos. 3,642,474 and 4,701,401.

Stripping films have been prepared on various temporary supports, e.g. on unsubbed cellulose triacetate sheet, a polyester sheet, a polystyrene sheet or a sheet of copoly(vinyl acetate/vinyl chloride) as described in U.S. Pat. No. 4,701,401.

Several measures have been proposed to improve adhesion in a dry state of a hydrophilic colloid layer on a polyester film support without however preventing the subsequent wet-stripping thereof.

Among the treatments to improve the dry-adherence of polyester film supports towards hydrophilic colloid layers that are recognized in the art are flame treatment described in U.S. Pat. No. 3,072,483 and electron bombardement and corona discharge treatment described in U.S. Pat. No. 3,220,842. However, these treatments often result in a too strong adhesion of hydrophilic colloid layers in a wet state to thus treated polyester supports. According to another technique the polyester support is first pre-coated with a sub-coating that is alkali-soluble so that a thereon coated silver halide emulsion can be peeled off easily after its treatment in alkaline developer solution and transferred to a permanent support, e.g. for the purpose of forming a decalcomania.

3. SUMMARY OF THE INVENTION

It is an object of the present invention to provide a subbed polyester stripping film material possessing good adherence to a dry hydrophilic colloid layer, e.g. gelatin-silver halide emulsion layer, but having the property of an easy stripping when moistened with an aqueous liquid, e.g. when brought into contact with the moistened surface of a permanent support.

It is a further object of the present invention to provide a process wherein a hardenable coloured hydrophilic colloid layer containing photosensitive silver halide from a specially subbed polyester film support is transferred in onto a moistened permanent support whereon it is imagewise exposed, hardening developed and wash-off processed to yield on said permanent support a coloured relief image.

It is another object of the present invention to provide a process wherein an imagewise exposed hardening developable coloured hydrophilic colloid layer containing photosensitive silver halide is transferred in a wet state from a specially subbed polyester film support onto a permanent support whereon it is hardening developed and wash-off processed to yield on said permanent support a coloured relief image.

It is still another object of the present invention to provide a process wherein a hydrophilic colloid silver halide emulsion layer is transferred from a specially subbed polyester support to an aluminium foil support to form thereon by the silver complex diffusion transfer process a silver image that after removal of the developed silver halide emulsion layer is made more oleophilic and selectively receptive to a lithographic printing ink to serve in the production of lithographic prints.

Other objects and advantages of the present invention will become clear from the further description and examples.

In accordance with the present invention a stripping film material is provided which comprises a polyethylene terephthalate film base serving as temporary support which is coated with a subbing layer essentially consisting of either (1) hydroxypropylcellulose wherein the molar degree of substitution (DS) with hydroxypropyl groups is in the range of 3 to 1, or:

(2) a copoly(vinyl acetate/crotonic acid) having a weight ratio of vinyl acetate to crotonic acid in the range of 85/15 to 99/1, wherein said subbing layer is coated with a hydrophilic colloid layer(s) the stripping off of which is possible after being moistened with an aqueous liquid, e.g. by contact with a wet surface of a permanent support.

4. DETAILED DESCRIPTION OF THE INVENTION

According to a first preferred embodiment in the preparation of a stripping film material according to the present invention a polyethylene terephthalate support is coated with a hydroxypropylcellulose compound having a molar hydroxypropyl substitution degree (DS) in the range of 3 to 1, and being characterized by a viscosity in the range of 75 to 150 mPa.s measured at 25° C. using a 10% by weight solution in water of said cellulose compound.

The maximum degree of substitution of cellulose is 3 because there are only 3 hydroxyl groups per cellulose unit available that can be etherified or esterified.

According to a second preferred embodiment in the preparation of a stripping film material according to the present invention a polyethylene terephthalate support is coated with a copoly(vinyl acetate/crotonic acid) having a weight ratio of vinyl acetate to crotonic acid in the range of 97/3 to 85/15, characterized by a viscosity in the range of 10 to 20 mPa.s measured at 20° C. using a 10% by weight solution of said copoly(vinyl acetate/crotonic acid) in ethyl acetate.

Good dry adherence of gelatin containing layers to a polyethylene terephthalate film support and easy wet stripping thereof is obtained with the defined subbing layers applied to said support at a dry coverage in the range of 0.010 to 0.5 g/m².

The polyethylene terephthalate support itself has preferably a thickness in the range of 50 to 250 μm and can be prepared by known extrusion and stretching techniques commonly applied in the art.

According to a preferred embodiment in the manufacturing of the stripping film material according to the present invention said subbing layer is applied after stretching longitudinally but before stretching transversely the polyethylene terephthalate film support.

Hydrophilic colloid layers that exhibit a good adherence in dry state to the above defined subbing layer contain gelatin as principal hydrophilic colloid binder.

The gelatin can be lime-treated or acid-treated gelatin. The preparation of such gelatin types has been described in e.g. "The Science and Technology of Gelatin", edited by A. G. Ward and A. Courts, Academic Press 1977, page 295 and next pages.

Gelatin has excellent layer forming coating properties due its sol-gel transformation but can be replaced partly by synthetic substitutes such as polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

Gelatin can be used likewise in conjunction with polymers in latex form as described e.g. in EP 0 383 283, wherein methyl or ethyl acrylate latices have been mentioned for use in combination with silver halide.

Optionally the additional binder should contain functional groups which allow reaction with an appropriate hardening agent in order to provide a sufficiently mechanically resistant layer. Such functional groups are especially the amino groups, but also carboxylic groups, hydroxy groups, and active methylene groups.

For the production of a photographic image the hydrophilic colloid layer applied to the subbed polyethylene terephthalate support contains a photosensitive substance which by imagewise photoexposure produces directly or through a development of the obtained latent image a visible image.

According to a special embodiment the image formation is based on an imagewise selective hardening of the hydrophilic colloid binder and selective wash-off of the non-hardened portions.

A preferred photosensitive substance by means of which on development after photo-exposure a visible image can be obtained is photosensitive silver halide the development of which results in the production of a silver image and optionally also in the imagewise hardening of the hydrophilic colloid binder the silver halide emulsion layer.

The present stripping film material is useful in a process described in U.S. Pat. No. 3,642,474 for the production of a multicolour image in the form of superposed coloured colloid patterns. This process proceeds with hydrophilic coloured colloid layers, which are hardened informationwise by means of an active species formed during or after the informationwise exposure to active electromagnetic radiation of a photosensitive substance, and comprises the following steps:

(1) transferring a coloured hydrophilic colloid layer containing a said photosensitive substance and a hydrophilic colloid, which undergoes a reduction in solubility in water by said active species, from a temporary support being a polyethylene terephthalate support having a subbing layer according to the present invention, which subbed support is still more hydrophobic than a permanent support to which said layer is to be transferred, wherein said transfer proceeds by pressing the permanent support in the presence of an aqueous liquid against said coloured hydrophilic colloid layer, and removing the temporary support, thus leaving said coloured hydrophilic colloid layer on the permanent support;

(2) exposing the transferred colloid layer in substantially dry state to active electromagnetic radiation which is modulated according to the information to be recorded, (3) developing the exposed layer by means of an aqueous liquid followed by a wash-off processing resulting in a coloured relief pattern, and repeating the steps (1), (2) and (3) with said hydrophilic colloid layers having a colour as desired to produce superposed coloured colloid patterns on the permanent support.

In said process for producing a multicolour pattern the exposures proceed in register on the same permanent support which received the unexposed coloured hardenable colloid layers by transfer from a temporary support, each transfer and exposure being followed by hardening development, wash-off step and a drying step before a next transfer and exposure leading to a further selected colour pattern can be carried out.

In most of the examples of said U.S. Pat. No. 3,642,474 an ultraviolet radiation sensitive iron (III) complex is used which yields iron (II) upon UV-irradiation forming by reaction with hydrogen peroxide hydroxyl radicals that imagewise harden the gelatin binder of each coloured layer. Said iron (III) complex, e.g. ammonium iron (III) oxalate, has a poor photosensitivity in comparison with silver halide which is preferred for use in combination with low intensity exposure sources as are used e.g. in colour scanners operating with an imagewise modulated laser beam.

A process for producing a multicolour pattern using silver halide emulsion materials is described in published European Patent Application (EP-A) 0 185 410.

As can be learned from said published EP-A a hardening developable coloured gelatin-silver halide emulsion layer on a temporary support is imagewise exposed by a scanning light spot whereupon the layer containing a latent image of exposed silver halide is transferred in entirety onto a permanent support whereon hardening development and wash-off processing takes place. For obtaining a multicolour print red, green and blue filter exposures representing halftone separation negatives or positives are made on separate silver halide emulsion layers that are complementary in colour (cyan, magenta and yellow). Optionally a black-printer separation is used in the exposure of a black or gray tinted photographic material to offer a better contrast rendering to the final multicolour image. The successive transfer, hardening development and wash-off processing on a common permanent support of said layers yields a subtractive multicolour image of superposed cyan, magenta and yellow relief portions, optionally combined with black-printer portions.

In accordance with the present invention each imagewise exposed hydrophilic colloid layer is transferred from its subbed polyethylene terephthalate support serving as temporary support onto a permanent support which may or may not carry already relief portion(s) of precedingly formed colour image(s) produced by wash-off processing.

In the production of said coloured silver halide emulsion preferably pigments or dyes are used that are diffusion-resistant in hydrophilic coloid medium. All kinds of colour, e.g. are cyan, light-cyan, magenta, warm magenta, black, yellow, green, brown, orange, red, white or blue can be used. Considered are likewise metallic colours such as pale gold, rich gold, copper, and silver. In other words the term "colour" in the present invention encompasses the use of all pure and mixed colours as well as black and white.

In the production of superposed multicolour colloid patterns used in colour proofing the pigments have to match with the absorption spectrum of the standard process inks as close as possible. Information about standard colour inks can be found in H. M. Cartwright—Ilford Graphic Arts Manual (1962) Vol. I—pages 502 to 504.

In the production of colour proofs the dyes used in the coloured layers are selected to correspond in spectral properties as close as possible to the colour of the printing inks, which for letterpress printing have colour tones as defined in DIN 16538 and for offset printing the colour tones defined in DIN 16539. Further information about colour tones can be found for the USA in the GATF-Colour Charts.

It has been found experimentally that pigments, which are insoluble or very poorly soluble in water and in organic liquids of the alcohol or polyhydric alcohol type, e.g. glycerol, fulfil the requirements of resistance to diffusion. For colour proofing purposes a hardenable colloid layer in the present photographic material should preferably contain said pigments in a concentration sufficiently high for obtaining an optical density of at least 0.35 in the wavelength range of maximum absorption.

When in addition to cyan, magenta and yellow relief patterns a black relief pattern is formed in colour proofing, preferably carbon black is used. Apart from carbon black mixtures of coloured pigments may be applied as described e.g. in U.S. Pat. No. 4,427,757.

In order to obtain images with a good resolution, relatively thin hardenable coloured gelatin containing coatings are used. Preferably such coatings having a thickness in the range of 1 $\mu$m and 15 $\mu$m are used and good results are obtained with pigment coloured layers containing 1 to 10 g of gelatin per sq.m.

Very good results from the standpoint of mutual adherence of the differently coloured relief portions are obtained with a composite layer structure of a pigmented gelatin layer containing silver halide coated in combination with a non-pigmented gelatin top layer having a combined thickness preferably in the range of 0.3 to 3 micrometer. The thickness of the pigmented gelatin silver halide emulsion layer is preferably twice that of the non-pigmented gelatin silver halide emulsion top layer.

The total gelatin coverage of said composite layer structure is preferably in the range of 1.0 to 3 g of gelatin per sq.m. The pigmented gelatin containing silver halide emulsion layer contains preferably at least 50% by weight of gelatin.

The photosensitive gelatin-silver halide emulsion layer coated over the subbing layer in the stripping film material of the present invention may be of any type, but for the copying of drawings or the production of halftone images (images built by dots of different sizes) the silver halide emulsion is of the type capable of producing contrasty (high-gradation) images.

The photographic silver halide emulsions may be of the negative or direct positive type, suited for use in silver complex diffusion transfer reversal processing, may be of low-speed for the production of room light handleable photographic materials, or may be of high-speed, e.g. for use in radiographic films or for use in films sensitive e.g. to He-Ne gas laser beam or semi-conductor solid state laser beams of relatively low energy.

According to a special embodiment the present stripping film material is used for coating a silver halide emulsion layer onto a permanent support whereon a silver image is formed by the silver complex diffusion transfer reversal process, briefly called herein DTR-process. The DTR-process has been described e.g. in U.S. Pat. No. 2,352,014 and in the book "Photographic Silver Halide Diffusion Processes" by André Rott and Edith Weyde, The Focal Press—London and New York (1972).

As can be learned from said book the DTR-process has found application in the production of a planographic printing plate wherein aluminium is used as printing image carrier material.

In a common embodiment for producing a lithographic printing form an aluminium plate is contacted in DTR-processing with a separate imagewise exposed silver halide emulsion sheet material in the presence of an aqueous alkaline liquid containing developing agent(s) and a silver halide complexing agent, usually an alkali metal thiosulfate. A reversal image of metallic silver is formed on the surface of the aluminium plate. By means of an after-treatment the silver deposit on the aluminium plate is made ink-receptive and the aluminium base ink-repellent hereby producing a lithographic printing form suited for use on a planographic offset printing press (ref. e.g. U.S. Pat. No. 3,511,656).

According to a modified embodiment in the preparation of a lithographic printing form, the silver halide emulsion layer is applied before its exposure to the aluminium support, that is pre-coated with developing nuclei acting as catalyst in the physical development of silver complex compounds stemming from the developed silver halide emulsion layer.

According to an embodiment of the present invention a silver halide emulsion layer applied on the subbing layer of the present stripping film material is transferred by stripping onto a moistened aluminium support that optionally has been pre-coated with developing nuclei. The thus transferred silver halide emulsion layer is then in dry state exposed imagewise and silver complex diffusion transfer reversal (DTR-processing) is carried out to form a DTR-silver image on the aluminium support that may serve as lithographic printing form.

A lithographic printing form is obtained by removing, e.g. with water jet, the developed silver halide emulsion layer that is pre-treated with a proteolytic enzyme, e.g. trypsin, degrading the gelatin binder of the silver halide emulsion layer (ref. published EP-A 0,278,766).

In order to dispense with the proteolytic treatment the silver halide emulsion layer in the present stripping film material is coated with an outermost water-swellable layer comprising a non-proteinic hydrophilic film-forming polymer, which outermost layer becomes an intermediate or interlayer after transfer together with the silver halide emulsion layer on the aluminium support. By the presence of said water-swellable interlayer the silver halide emulsion layer having been DTR-processed on the aluminium support is easily removed together with said interlayer by water jet at a temperature of 20° C.

Particulars about said interlayer and its coating and use are described in unpublished EP-A No. 90201858.9 filed Jul. 10, 1990 and corresponding U.S. Ser. No. 07/552,945, now U.S. Pat. No. 5,068,165.

The photosensitive silver halide of the hydrophilic colloid silver halide emulsion layer applied as strippable layer to the subbed polyethylene terephthalate film support according to the present invention may comprise silver chloride, silver bromide, silver bromoiodide, silver chlorobromoiodide and the like, or mixtures thereof. The silver halide may be of any morphological crystal type, e.g. is in the form of globular, cubic or tabular grains. The silver halide emulsions may be coarse or fine grain and can be prepared by any of the well known procedures, e.g., single jet emulsions, double jet emulsions, such as Lippmann emulsions, ammoniacal emulsions, thiocyanate- or thioether-ripened emulsions such as those described in U.S. Pat. No. 2,222,264 of Adolph H. Nietz and Frederick J. Russell, issued Nov. 19, 1940, 3,320,069 of Bernard D. Illingsworth, issued May 16, 1967, and 3,271,157 of Clarence E. McBride, issued Sep. 6, 1966. Surface image emulsions may be used or internal image emulsions may be used such as those described in U.S. Pat. Nos. 2,592,250 of Edward Philip Davey and Edward Bowes Knott, issued Apr. 8, 1952, 3,206,313 of Henry D. Porter, Thomas H. James and Wesley G. Lowe, issued Sep. 14, 1965, and 3,447,927 of Robert E. Bacon and Jean F. Barbier, issued Jun. 3, 1969. The emulsions may be regular-grain emulsions such as the type described by Klein and Moisar in J. Photogr. Sci., Vol. 12, No. 5, September/October 1964, pp. 242–251. If desired, mixtures of surface and internal image emulsions may be used as described in U.S. Pat. No. 2,996,382 of George W. Luckey and John C. Hoppe, issued Aug. 15, 1961.

The light-sensitive silver halide emulsion can be a so-called primitive emulsion, in other words an emulsion that has not been chemically sensitized. However, the light-sensitive silver halide emulsion can be chemically sensitized as described i.a. in the above-mentioned "Chimie et Physique Photographique" by P. Glafkides, in the above-mentioned "Photographic Emulsion Chemistry" by G. F. Duffin, in the above-mentioned "Making and Coating Photographic Emulsion" by V. L. Zelikman et al, and in "Die Grundlagen der Photographischen Prozesse mit Silberhalogeniden" edited by H. Frieser and published by Akademische Verlagsgesellschaft (1968). As described in said literature chemical sensitization can be carried out by effecting the ripening in the presence of small amounts of compounds containing sulphur e.g. thiosulphate, thiocyanate, thioureas, sulphites, mercapto compounds, and rhodamines. The emulsions can be sensitized also by means of goldsulphur ripeners or by means of reductors e.g. tin compounds as described in GB-A 789,823, amines, hydrazine derivatives, formamidine-sulphinic acids, and silane compounds. Chemical sensitization can also be performed with small amounts of Ir, Rh, Ru, Pb, Cd, Hg, Tl, Pd, Pt, or Au. One of these chemical sensitization methods or a combination thereof can be used.

The light-sensitive emulsions may be direct-positive emulsions, e.g. as described in U.S. Pat. No. 4,073,652.

The light-sensitive silver halide emulsions can be spectrally sensitized with methine dyes such as those described by F. M. Hamer in "The Cyanine Dyes and Related Compounds", 1964, John Wiley & Sons. Dyes that can be used for the purpose of spectral sensitization include cyanine dyes, merocyanine dyes, complex cyanine dyes, complex merocyanine dyes, holopolar cyanine dyes, hemicyanine dyes, styryl dyes and hemioxonol dyes. Particularly valuable dyes are those belonging to the cyanine dyes, merocyanine dyes, complex merocyanine dyes.

Other dyes, which per se do not have any spectral sensitization activity, or certain other compounds, which do not substantially absorb visible radiation, can have a supersensitization effect when they are incorporated together with said spectral sensitizing agents into the emulsion. Suitable supersensitizers are i.a. heterocyclic mercapto compounds containing at least one electronegative substituent as described e.g. in U.S. Pat. No. 3,457,078, nitrogen-containing heterocyclic ring-substituted aminostilbene compounds as described e.g. in U.S. Pat. No. 2,933,390 and U.S. Pat. No. 3,635,721, aromatic organic acid/formaldehyde condensation products as described e.g. in U.S. Pat. No. 3,743,510, cadmium salts, and azaindene compounds.

The silver halide emulsion for use in accordance with the present invention may comprise compounds preventing the formation of fog or stabilizing the photographic characteristics during the production or storage of photographic elements or during the photographic treatment thereof. Many known compounds can be added as fog-inhibiting agent or stabilizer to the silver halide emulsion. Suitable examples are i.a. the heterocyclic nitrogen-containing compounds such as benzothiazolium salts, nitroimidazoles, nitrobenzimidazoles, chlorobenzimidazoles, bromobenzimidazoles, mercaptothiazoles, mercaptobenzothiazoles, mercaptobenzimidazoles, mercaptothiadiazoles, aminotriazoles, benzotriazoles (preferably 5-methyl-benzotriazole), nitrobenzotriazoles, mercaptotetrazoles, in particular 1-phenyl-5-mercapto-tetrazole, mercaptopyrimidines, mercaptotriazines, benzothiazoline-2-thione, oxazolinethione, triazaindenes, tetrazaindenes and pentzaindenes, especially those described by Birr in Z. Wiss. Phot. 47 (1952), pages 2–58, triazolopyrimidines such as those described in GB-A 1,203,757, GB-A 1,209,146, JA-Appl. 75-39537, and GB-A 1,500,278, and 7-hydroxy-s-triazolo-[1,5-a]-pyrimidines as described in U.S. Pat. No. 4,727,017, and other compounds such as benzenethiosulphonic acid, benzenethiosulphinic acid, benzenethiosulphonic acid amide. Other compounds that can be used as fog-inhibiting compounds are metal salts such as e.g. mercury or cadmium salts and the compounds described in Research Disclosure No. 17643 (1978), Chapter VI.

The fog-inhibiting agents or stabilizers can be added to the silver halide emulsion prior to, during, or after the ripening thereof and mixtures of two or more of these compounds can be used.

Further various kinds of surface-active agents may be present in the photographic emulsion layer or in at least one other hydrophilic colloid layer. Suitable surface-active agents include non-ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Such surface-active agents can be used for various purposes e.g. as coating acids, as compounds preventing electric charges, as compounds improving slidability, as compounds facilitating dispersive emulsification, as compounds preventing or reducing adhesion, and as compounds improving the photographic characteristics e.g. higher contrast, sensitization, and development acceleration.

Development acceleration can be accomplished with the aid of various compounds, preferably polyalkylene derivatives having a molecular weight of at least 400 such as those described in e.g. U.S. Pat. No. 3,038,805—4,038,075—4,292,400.

The photographic silver halide emulsion layer or adjacent hydrophilic colloid layer may further comprise various other additives such as e.g. compounds improving the dimensional stability of the photographic element, UV-absorbers, spacing agents, hardeners, and plasticizers.

Suitable additives for improving the dimensional stability of the photographic element are i.a. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth)acrylates, sulphoalkyl (meth)acrylates, and styrene sulphonic acids.

Suitable UV-absorbers are i.a. aryl-substituted benzotriazole compounds as described in U.S. Pat. No. 3,533,794, 4-thiazolidone compounds as described in U.S. Pat. Nos. 3,314,794 and 3,352,681, benzophenone compounds as described in JP-A 2784/71, cinnamic ester compounds as described in U.S. Pat. Nos. 3,705,805 and 3,707,375, butadiene compounds as described in U.S. Pat. No. 4,045,229, and benzoxazole compounds as describd in U.S. Pat. No. 3,700,455.

Processing to form a visible and fixed silver image and/or colour image produced in conjunction therewith can be of any type known in the art, e.g. as described in "Research Disclosure" Sections XIX-XXIV of December 1978, item 17643.

The stripping film according to the present invention can be used in the production of decalcomanias contaiting a photographically produced image, either black-and-white, mono-colour or multi-colour image produced in a silver halide emulsion layer or assemblage of silver halide emulsion layers known in the art, e.g. by silver image development, chromogenic development or dye-bleach development.

Examples of suitable developing agents for black-and-white are: 1,4-dihydroxy benzene compounds such as hydroquinone, (particularly suited for hardening development), chlorohydroquinone, bromohydroquinone, toluhydroquinone, morpholinemethyl hydroquinone, and sulfohydroquinone. Other developing agents that may be used in conjunction therewith as auxiliary developing agents are 3-pyrazolidinone type developing agents, e.g. 1-phenyl-3-pyrazolidinone, 1-phenyl-4,4-dimethyl-3-pyrazolidinone, and 1-phenyl-4-methyl-4'-hydroxymethyl-3-pyrazolidinone and/or N-methyl-p-aminophenol sulphate.

Colour development usually proceeds with a p-phenylene diamine type developing agent in the presence of colour couplers known to those skilled in the art. Chromogenic development with colour couplers is followed by bleaching of the silver image and fixing.

Silver bleaching liquids generally comprise a dissolved oxidizing agent, e.g. iron (III) complex compound, watersoluble persulfate and the like.

Fixing liquids comprise compounds that form soluble silver salts by reaction with remaining silver halide. Common examples of fixing agents, also called silver halide solvents, are compounds providing thiosulfate ions, e.g. sodium thiosulfate or ammonium thiosulfate, or provide thiocyanate ions as e.g. potassium thiocyanate.

The formation of particularly light-stable mono- or multi-colour images can proceed by dye destruction (dye-bleach process) through photographically formed silver images. The principles of said process examples of ingredients used therein are described in "Imaging Systems" by Kurt I. Jacobson-Ralph E. Jacobson—The Focal Press London and New York (1976), p. 78–81.

The photographic formation of dye images controlled by silver halide development may proceed likewise by a dye diffusion transfer process several embodiments of which are described by Christian C. Van de Sande in Angew. Chem. Int. Ed. Engl. 22, (1983), p. 191–209.

Usually the developing agent is incorporated in an aqueous alkaline processing liquid. When incorporated in the silver halide emulsion layer, and/or in a non-silver halide containing layer adjacent thereto the development can be obtained by treating the photo-exposed silver halide emulsion layer material with an alkaline aqueous "activator liquid" originally free from developing agent.

Typical activator liquids used in the development of photographic silver halide emulsion materials comprise, for example, and aqueous solution of an alkaline material, such as sodium carbonate, sodium hydroxide, potassium carbonate, potassium hydroxide, mixtures of sodium hydroxide and sodium sulfite, hydroxyalkylamines, e.g. triethanolamine, etc. A suitable activator bath comprises e.g. about 2 percent by weight of sodium hydroxide and 0.5 percent by weight of sodium sulfite.

More details about composition, preparation, coating and processing of silver halide emulsions are described, e.g., in Product Licensing Index, Vol. 92, December 1971, publication 9232, p. 107–109 and Research Disclosure November (1989) No. 307105, p. 863–885 and in Research Disclosure December 1989, item 308119.

The present invention is illustrated by the following examples without however limiting it thereto. All parts, ratios and percentages are by weight unless otherwise stated.

EXAMPLE 1

Preparation of Photographic Stripping Film

Onto an unsubbed biaxially stretched polyethylene terephthalate film having a thickness of 100 micron the following coating composition was applied:

| | |
|---|---|
| copoly(vinyl acetate/crotonic acid (95/5) | 1.5 g |
| isopropanol | 100 ml |
| 1 N aqueous ammonia solution | 10 ml |
| solution A | 4 ml |

-continued

| | |
|---|---|
| water up to | 1000 ml |

Solution A is a 5% solution in a mixture of $H_2O$/ethanol (50/50) of ARKOPAL N 060 (tradename of Hoechst AG—Germany). ARKOPAL N 060 is an ethoxylated nonylphenol wetting agent.

Said composition was coated at a coverage of 30 m² per liter, forming a subbing layer with dry coverage of 0.05 g/m².

The coating was dried with air at 120° C. whereby ammonia was evaporated and the copolymer was practically completely retransformed into the free acid form.

Onto said subbing layer acting as adherence improving layer for a dry gelatin-containing layer but allowing easy stripping of said layer in wet state the following wet-strippable layer assemblage was applied in the order given:

(i) a silver chlorobromide-iodide emulsion (molar ratio 83.6/16/0.4) containing diffusion-resistant cyan coloured pigment and having a silver halide coverage equivalent with 0.25 g of silver per sq.m. and gelatin coverage of 1.8 g per sq.m. The emulsion was spectrally sensitized for argon ion laser light. The cyan pigment was FLEXONYL BLUE Paste (C.I. Index Nr. 74,160) which was applied at 6.3 g per liter of coating composition corresponding with 0.126 g of pigment solid per m². The pH of the coating composition was 5.0; and (ii) a non pigmented gelatin binder layer containing per sq.m 0.7 g of gelatin, 0.066 g of hydroquinone and 0.095 g of matting agent on the basis of silica particles coated with urea formaldehyde resin.

Exposure

The photographic layer on the above temporary support was scanningwise halftone exposed on a commercial argon ion laser scanner operating with electronic dot generation.

Transfer

In the exposed state the cyan pigment containing multilayer structure was transferred onto a permanent support SM prepared as described hereinafter by soaking the permanent support in water for 15 s and then pressing it into contact with layer (ii). After 15 s pressure contact with the wet surface of the permanent support the temporary support was stripped apart leaving the composite layer structure of layers (i) and (ii) on the permanent support and the transferred composite layer was dried.

Hardening Development

The transferred composite coating was hardening developed by dipping it for 30 s in an aqueous liquid, called activator bath, having following composition:

| | |
|---|---|
| potassium hydroxide | 25 g |
| potassium carbonate | 150 g |
| potassium bromide | 0.5 g |
| sodium sulphite | 2.0 g |
| 4(hydroxymethyl)4-methyl-1-phenyl-3-pyrazolidinone | 5.0 g |
| monosodium salt of ethylenediaminetetra-acetic acid | 1.0 g |

Bleach-Fixing

The developed material was led through a bleach-fix bath containing sodium thiosulphate and the mono sodium,iron(III) salt of ethylenediamine tetra-acetic acid.

Wash-Off Processing

To obtain a cyan coloured relief image the hardening developed and bleach-fix processed material was wash-off processed with a warm (40° C.) water spray. The relief image was dried.

Preparation of the Permanent Support SM

A double-side polyethylene coated paper with paper weight of 180 g/m2 and a polyethylene layer weight of 30 g per m2 was air-knife coated at a wet coverage of 55 g per m2 with the following coating composition:

| | |
|---|---|
| distilled water | 300 ml |
| gelatin | 19.8 g |
| 20% aqueous latex of copoly(methylmethacrylate-butadiene) (50/50) | 151 g |
| aqueous dispersion containing 2.86% of polymethylmethacrylate and 9.5% of gelatin | 25.5 g |
| 21.4% aqueous dispersion of $TiO_2$ (average grain size 300 nm) containing 5.7% of gelatin | 131 g |
| matting agent A | 5.8 g |
| matting agent B | 2.8 g |
| wetting agents of the anionic sulphonated type | 2.8 g |
| as hardening agent a 20% aqueous solution of formaldehyde | 2.2 ml |
| distilled water up to | 1000 ml |

Matting agent A is an aqueous dispersion containing 10.7% of amorphous silica, 6.4% of gelatin and 4.3% of polyethylacrylate latex particles.

Matting agent B is an aqueous dispersion containing 41.8% of Alpha-quartz and 4.2% of gelatin.

The weight % of $TiO_2$ with respect to the total layer composition was 29.5 in the dried layer. The coverage of $TiO_2$ was 1.54 g/m2.

EXAMPLE 2

Example 1 was repeated with the difference that the subbing layer was coated from the following coating composition:

| | |
|---|---|
| Hydroxypropylcellulose (DS:3) | 0.2 parts |
| GAFAC RM 710 (trade name) 10% aqueous solution | 1 ml |
| water | 100 ml |

Said composition was coated at 20 m² per liter yielding a dry coating coverage of 100 mg/m².

GAFAC RM 710 is a tradename for an alkylphenyl-polyethyleneoxide phosphate wetting agent marketed by General Aniline USA.

EXAMPLE 3

Example 1 was repeated with the difference that the subbing layer was coated onto a longitudinally stretched (3.5 times its initial length) of polyethylene terephthalate film using the following coating composition applied at a wet coverage of 1 l per 130 m²:

| | |
|---|---|
| ethanol | 30 ml |
| 1 N aqueous ammonia solution | 140 ml |
| copoly(vinylacetate/crotonic acid) (95/5) | 21.8 g |
| solution A | 8 ml |

| | |
|---|---|
| -continued | |
| water | 810 ml |

The resulting layer was dried in a hot air stream (70° C.). The subbed film was stretched transversely to 3.5 times its original width at a temperature of about 80° C. The film was then heat-set while being kept under tension at a temperature of 200° C. for about 10 seconds.

The dry stretched subbing layer had a weight of 48 mg/m$^2$.

We claim:

1. A stripping film material comprising:
   A. A polyethylene terephthalate film temporary support;
   B. A subbing layer coated on a surface of said temporary support and consisting essentially of either:
      1. Hydroxypropylcellulose having a molar degree of substitution (DS) of hydroxypropyl groups in the range of 3 to 1, or
      2. A copoly(vinyl acetate/crotonic acid) having a weight ratio of vinyl acetate to crotonic acid in the range of 85/15 to 99/1; and
   C. At least one hydrophilic colloid layer coated on a surface of said subbing layer opposite said temporary support and containing gelatin as the principal hydrophilic colloid thereof, said colloid layer being adapted to be stripped from said subbing layer after being moistened with an aqueous liquid.

2. The stripping film material of claim 1 wherein said hydroxypropylcellulose has a viscosity in the range of 75 to 150 mPa.s measured at 25° C. as a 10% by weight solution in water.

3. Stripping film material according to claim 1, wherein said copoly(vinyl acetate/crotonic acid) has a weight ratio of vinyl acetate to crotonic acid in the range of 97/3 to 85/15, and is characterized by a viscosity in the range of 10 to 20 mPa.s measured at 20° C. using a 10% by weight solution of said copoly(vinyl acetate/crotonic acid) in ethyl acetate.

4. Stripping film material according to claim 1, wherein the said subbing layer is applied to said support at a dry coverage in the range of 0.010 to 0.5 g/m$^2$.

5. Stripping film material according to claim 1, wherein the polyethylene terephthalate support has a thickness in the range of 50 to 250 μm.

6. The stripping film material of claim 1 wherein at least one of said hydrophilic colloid layers is a gelatin-silver halide emulsion layer adapted to be processed to form a black and white image.

7. The stripping film material of claim 1 wherein at least one of said hydrophilic colloid layers is a gelatin-silver halide colloid layer adapted to be processed to form a colored image of at least one color which is adapted to be stripped off.

8. Stripping film material according to claim 6, wherein at least one of said gelatin-silver halide emulsion layers is hardening developable and contains a hardening developing agent.

* * * * *